US006555480B2

(12) United States Patent
Milligan et al.

(10) Patent No.: US 6,555,480 B2
(45) Date of Patent: Apr. 29, 2003

(54) SUBSTRATE WITH FLUIDIC CHANNEL AND METHOD OF MANUFACTURING

(75) Inventors: Donald J Milligan, Corvallis, OR (US); Tim R Koch, Corvallis, OR (US); Martha A Truninger, Corvallis, OR (US); Diane W Lai, Corvallis, OR (US); Timothy R Emery, Corvallis, OR (US); J. Daniel Smith, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 115 days.

(21) Appl. No.: 09/919,550

(22) Filed: Jul. 31, 2001

(65) Prior Publication Data

US 2003/0027426 A1 Feb. 6, 2003

(51) Int. Cl.$^{7}$ ................................................ H01L 21/00

(52) U.S. Cl. ............................ 438/719; 216/2; 216/27; 438/739; 438/740

(58) Field of Search ................................ 216/2, 27, 33, 216/41, 67, 79, 99; 438/719, 723, 735, 737, 738, 739, 743, 740; 346/140; 428/131, 137, 596

(56) References Cited

U.S. PATENT DOCUMENTS

| | | | | |
|---|---|---|---|---|
| 5,387,314 | A | 2/1995 | Baughman et al. | 156/643 |
| 5,393,711 | A | 2/1995 | Biallas et al. | 437/231 |
| 5,441,593 | A | 8/1995 | Baughman et al. | 216/27 |
| 5,498,312 | A | 3/1996 | Laermer et al. | 156/643.1 |
| 5,501,893 | A | 3/1996 | Laermer et al. | 428/161 |
| 5,526,454 | A | 6/1996 | Mayer | 385/49 |
| 5,541,140 | A | 7/1996 | Goebel et al. | 437/226 |
| 5,756,901 | A | 5/1998 | Kurle et al. | 73/777 |
| 6,008,138 | A | 12/1999 | Laermer et al. | 438/725 |
| 6,051,503 | A | 4/2000 | Bhardwaj et al. | |
| 6,081,635 | A | 6/2000 | Hehmann | 385/24 |
| 6,096,656 | A | 8/2000 | Matzke et al. | 438/702 |
| 6,107,209 | A * | 8/2000 | Ohkuma | 438/739 X |

FOREIGN PATENT DOCUMENTS

| | | | | |
|---|---|---|---|---|
| DE | 19538103 A1 | 4/1997 | G02B/6/30 |
| EP | 0822582 A2 | 2/1988 | |
| EP | 0865151 A2 | 9/1998 | H02N/1/00 |
| EP | 0886307 A2 | 12/1998 | |
| EP | 0978832 A2 | 2/2000 | G11B/9/00 |
| GB | 2245366 A | 1/1992 | G01P/15/02 |
| GB | 2290413 A | 12/1995 | |
| GB | 2341348 A | 3/2000 | |
| JP | 60154622 A | 8/1985 | |
| JP | 63013334 A | 1/1988 | |
| JP | 03196623 A | 8/1991 | |
| JP | 04045529 A | 2/1992 | |
| JP | 04218925 A | 8/1992 | |
| WO | WO 9837577 | 8/1998 | |
| WO | WO 0023376 | 4/2000 | B81B/3/00 |

OTHER PUBLICATIONS

2001 Institution Of Electrical Engineers; "An Array Of Hollow Microcapillaries For The Controlled Injection Of Genetic Materials Into Animal/Plant Cells"; by: K. Chun et al.;Electrical Mechanical Systems (MEMS); Abstract Only; Copyright 1999, IEE.

2001 Institution Of Electrical Engineers: "Cryogenic Etching Of Deep Narrow Trenches In Silicon"; by: Aachboun et al.; Journal Of Vacuum Science & Technology A; vol. 18; No. 4; pt. 1–2; Abstract only; Copyright 2000, IEE.

"Deep Etching Key To The MEMS/MST Revolution"; by: Gadil Prashant;Copyright 1998 Reed Publishing USA or 1999 Gale Group; p. 38;Jul. 1998.

(List continued on next page.)

*Primary Examiner*—William A. Powell
(74) *Attorney, Agent, or Firm*—Lucinda G. Price

(57) ABSTRACT

A method of manufacturing a fluidic channel through a substrate includes etching an exposed section on a first surface of the substrate, and coating the etched section of the substrate. The etching and the coating are alternatingly repeated until the fluidic channel is formed.

66 Claims, 18 Drawing Sheets

OTHER PUBLICATIONS

"Anisotropic Silicon Etch Characterization In The TFTL STS Etcher"; Aug. 20, 1999; pp. 1–5.

"Etching Characteristics And Profile Control In A Time Multiplexed Inductively Coupled Plasma Etcher"; by: AA Ayon, CC Lin, RA Braff & MA Schmidt of the Department of Electrical Engineering And Computer Science (EECS); Solid–State Sensor and Actuator Workshop Hilton Head Island, SC; Jun. 8–11, 1999; pp. 41–44.

"Characterization of a Time Multiplexed Inductively Coupled Plasma Etcher"; by: AA Ayon, R Braff, CC Lin HH Sawin & MA Schmidt; Journal of The Electrochemical Society; 146 (1); 1999; pp. 339–349.

"Bosch Deep Silicon Etching: Improving Uniformity And Etch"; by: F Laermer A Schilp K Funk & M Offenberg; Bosch GmBH, Germany; 1999 IEEE; pp: 211–216.

"Recent Advances In Silicon Etching For MEMS Using The ASE Process"; by: AM Hymes H Ashraf JK Bhardwaj J Hopkins I Johnson & JN Shepherd;Sensors And Actuators A Physical; 1999; pp:13–17.

"Advanced Silicon Etching Using High Density Plasms"; by: JK Bhardwaj & H Ashraf; Reprinted from: Micromachining And Microfabrication Process Technology; SPIE—The International Society For Optical Engineering; vol. 2639; 1995; pp: 224–237.

STS—Surface Technology Systems—1st ASE Users Meeting Agenda and Information; California; 1997; pp. 1–38.

"High–Aspect–Ratio Si Etching For Microsensor Fabrication"; by: WHJuan & SW Pang; Journal of Vacuum Sci. Technology A; 1995; pp: 834–838.

* cited by examiner

SUBSTRATE WITH FLUIDIC CHANNEL AND METHOD OF MANUFACTURING

FIELD OF THE INVENTION

The present invention relates to substrates with fluidic channels and methods for manufacturing.

BACKGROUND OF THE INVENTION

In some fluid ejection devices, such as printheads, fluid is routed to an ejection chamber through a slot in the substrate. Often, slots are formed in a wafer by wet chemical etching with, for example, alkaline etchants. Such etching techniques result in etch angles that cause a very wide backside slot opening. The wide backside opening limits how small a particular die on the wafer could be and therefore limits the number of die per wafer (the separation ratio). It is desired to maximize the separation ratio.

SUMMARY

In one embodiment, a method of manufacturing a fluidic channel through a substrate includes etching an exposed section on a first surface of the substrate, and coating the etched section of the substrate. The etching and the coating are alternatingly repeated until the fluidic channel is formed.

Many of the attendant features of this invention will be more readily appreciated as the same becomes better understood by reference to the following detailed description and considered in connection with the accompanying drawings in which like reference symbols designate like parts throughout.

DETAILED DESCRIPTION

Figure 1:
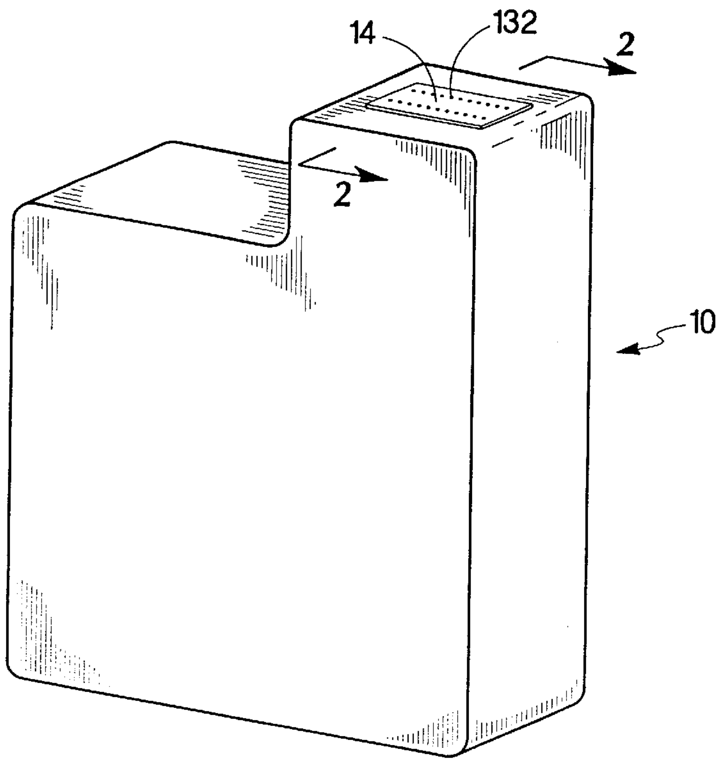
FIG. 1 illustrates a perspective view of an embodiment of a print cartridge of the present invention.
Figure 2A:
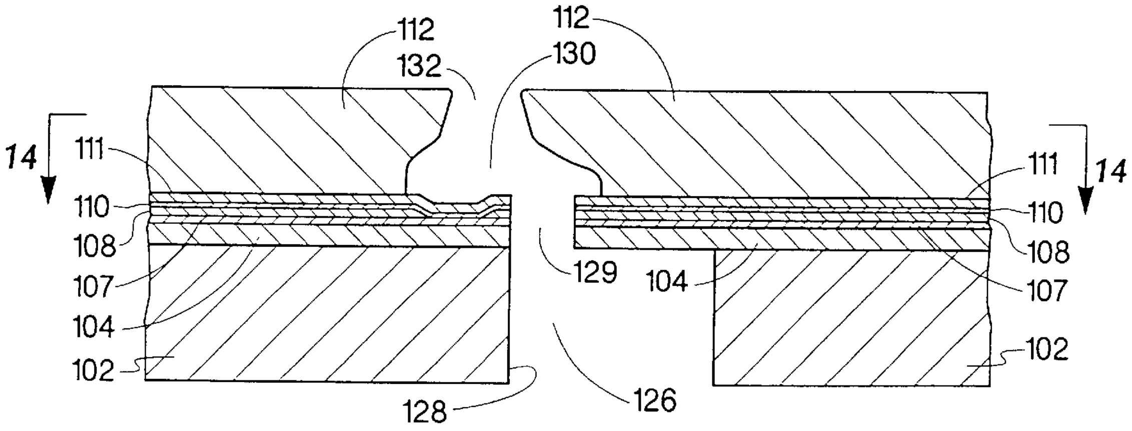
FIG. 2A illustrates a cross-sectional view of a printhead taken from section 2—2 of the cartridge of FIG. 1.

FIG. 1 is a perspective view of an inkjet cartridge 10 with a printhead (or fluid drop generator or fluid ejection device) 14 of an embodiment of the present invention. FIG. 2A illustrates a cross-sectional view of the printhead where a slot region (or slot or trench) 126 having trench (or side) walls 128 is formed through a substrate 102. The formation of the slot is described in more detail below. In is a particular embodiment, the slot 126 is etched with dimensional control less than 10 microns using the present invention. In another embodiment, a higher density of slots is etched in a given die.

As shown in the embodiment of the printhead shown in FIG. 2A, a capping layer 104, a resistive layer 107, a conductive layer 108, a passivation layer 110, a cavitation barrier layer 111, and a barrier layer 112 are formed or deposited over the substrate 102. In this embodiment, the thin film layers are patterned and etched, as appropriate, to form resistors of the resistive layer, conductive traces of the conductive layer, and a firing chamber 130 in the barrier layer. In a particular embodiment, the barrier layer 112 defines the firing chamber 130 where fluid is heated by the corresponding resistor, and a nozzle orifice 132 through which the heated fluid is ejected. In another embodiment, an orifice layer (not shown) having the orifices 132 is applied over the barrier layer 112. An example of the physical arrangement of the barrier layer, and thin film substructure is illustrated at page 44 of the Hewlett-Packard Journal of February 1994, cited above. Further examples of ink jet printheads are set forth in commonly assigned U.S. Pat. No. 4,719,477, U.S. Pat. No. 5,317,346, and U.S. Pat. No. 6,162,589.

In another embodiment shown, at least one layer or thin film layer is formed or deposited upon the substrate 102. Embodiments of the present invention include having any number and type of layers formed or deposited over the substrate (or no layers at all), depending upon the application for which the slotted substrate is to be utilized.

Figure 2B:
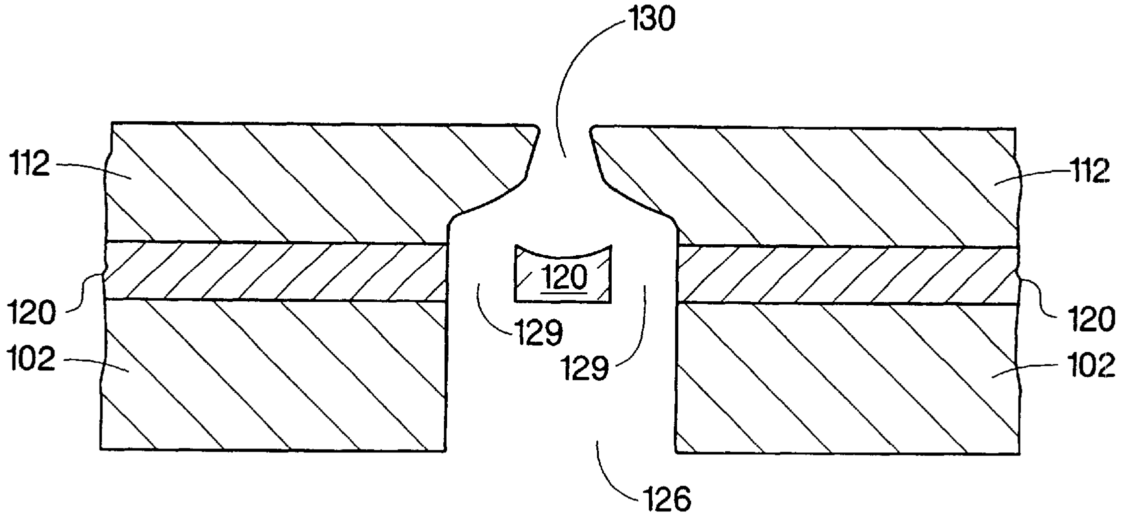
FIG. 2B illustrates a cross-sectional view of an alternative printhead to FIG. 2A.

In the embodiment shown in FIG. 2A, a channel 129 is formed as a hole or fluid feed slot through the layers upon the substrate. The channel 129 fluidically couples the firing chamber 130 and the slot 126, such that fluid flows through the slot 126 and into the firing chamber 130 via channel 129. In the particular embodiment shown, the channel entrance 129 for the fluid is not in the center of the slot 126. However, the slotted substrate is formed substantially the same in either instance where the entrance 129 is centrally located or off-center, as described below. In another embodiment which is shown in FIG. 2B, at least two of the channels (or recesses) 129 fluidically couple the slotted substrate with a single firing chamber 130.

Figure 3A:
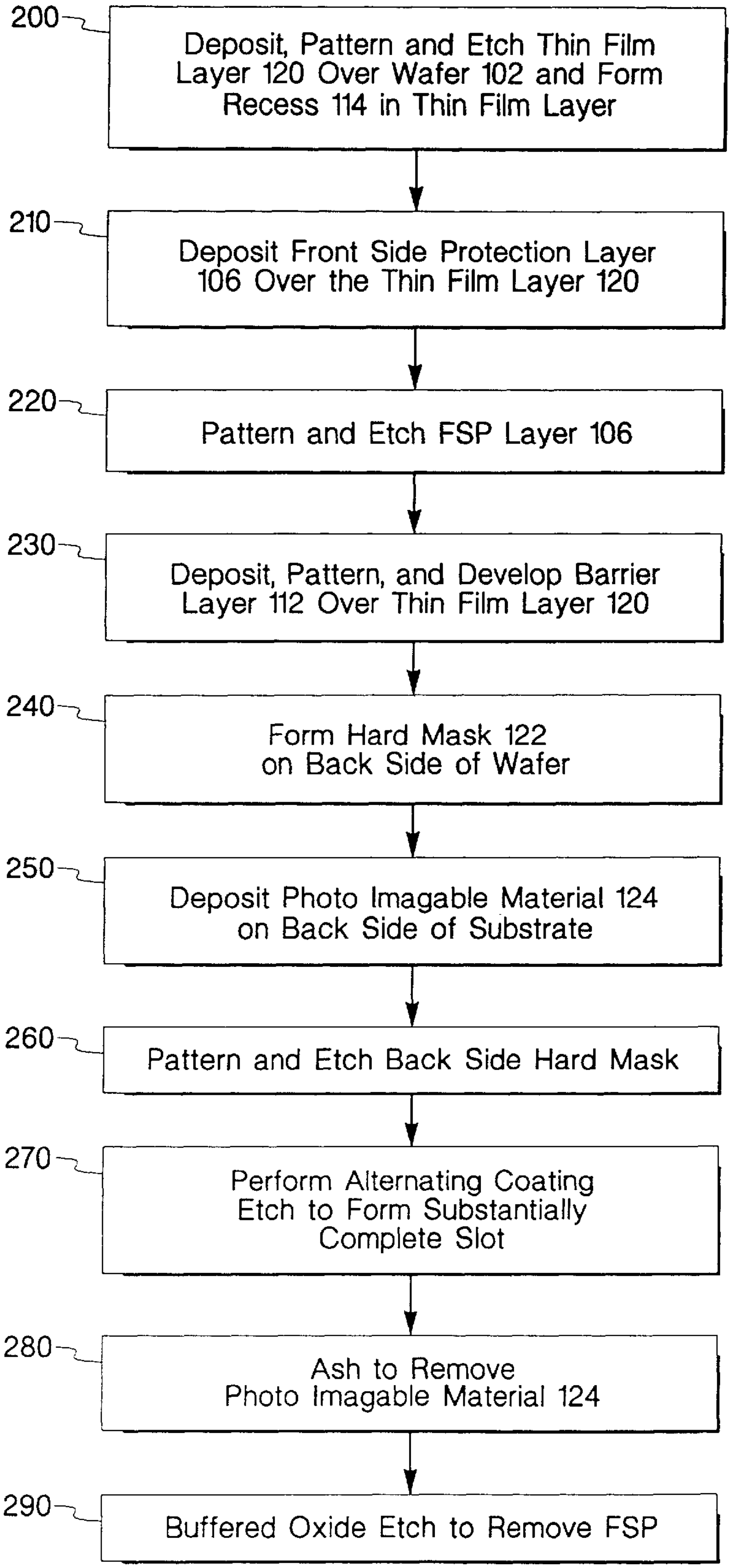
FIGS. 3A to 3E illustrate process flow charts for several alternative embodiments of the manufacturing process for forming a slotted substrate according to the present invention.
Figure 4A:
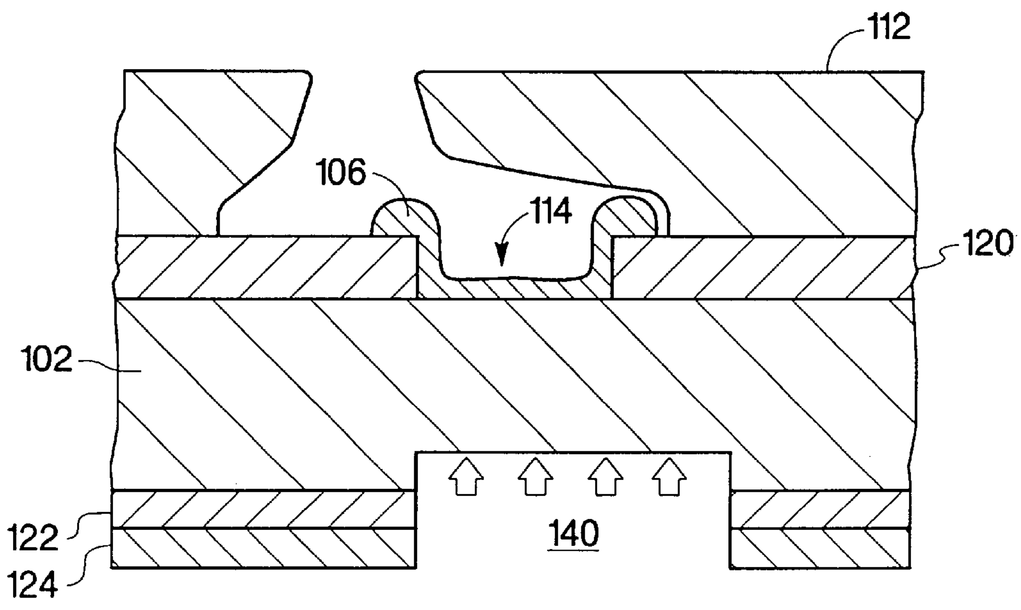
FIGS. 4A to 4C illustrate steps of forming the slotted substrate according to the process described in FIG. 3A.

In the embodiment described at steps 200 to 230 in the flow chart of FIG. 3A and illustrated in FIG. 4A, a thin film layer (or stack) 120 is formed or deposited on a front side of the substrate. The thin film stack 120 is at least one layer formed on the substrate, and, in a particular embodiment, masks the substrate 102. Alternatively or additionally, the layer 120 electrically insulates the substrate 102.

The thin film layer 120 of FIG. 4A is patterned and etched to form a hole therethrough, wherein the hole defines a recess 114. In this embodiment, a front side protection (FSP) layer 106 is then deposited over the thin film layer 120 and into the recess 114. In a particular embodiment, in the area of the recess 114, a top surface of the FSP layer 106 slopes down towards the substrate 102. The FSP layer is patterned and etched to form a plug in the layer 120 to serve as an etch stop and/or to protect layers formed on the substrate (e.g. SU-8) from ashing and/or etching gasses, as described below. In the embodiment illustrated, the layer 112 is deposited, patterned and formed thereover. However, the layer 112 is not present in some embodiments, depending upon the application. In another embodiment, additional layers are deposited over the substrate after the slot is formed, depending upon the application.

In the embodiment described in the flow chart of FIG. 3A at steps 240 and 250, a hard mask 122 and a photoimagable material layer 124 are formed on a back side of the substrate opposite the thin film layer 120. Layers 122 and 124 are one of grown, deposited, spun, laminated or sprayed on the substrate. In a particular alternative embodiment, the back side mask (the hard mask and/or the photoimagable layer) is formed during formation of the thin film layer in step 200.

As described in step 260 and shown in FIG. 4A, the mask 122 and photoimagable material 124 are patterned and etched to expose a section of the substrate 102. The section exposed on the back side of the substrate is substantially opposite the recess 114 in the thin film layer 120 and, in a particular embodiment, is substantially the desired width of the slot to be formed.

In one embodiment, the term 'hard mask' or 'back side mask' can include layers 122 and 124, in other words, the 'back side mask' refers to one layer or multiple layers or all the layers on the back side of the substrate. For example, the layers 122 and 124 of the back side mask are of the same material. In particular, the material for the hard mask 122 and/or the photoimagable material 124 is at least one of oxide, such as thermal oxide or FOX, a deposited film which is selective to the etch, a photoimagable material, such as photoresist material or a photosensitive resin, and material used for the barrier layer 112 (see below for barrier layer materials).

Depending upon the materials being used and the configuration of the back side mask, the thicknesses of layers 122 and 124 vary. In the first embodiment, the photoimagable material has a thickness of at least about 10 to 18 microns. In other embodiments, the photoimagable material is at least 34 microns, depending upon the type of machine used for etching, how thick the wafer is and the type of material being used as the photoimagable material. In one embodiment, the oxide has a thickness of up to about 2 microns. In a more particular embodiment, the oxide layer has a thickness of about 1 micron.

Figure 4B:
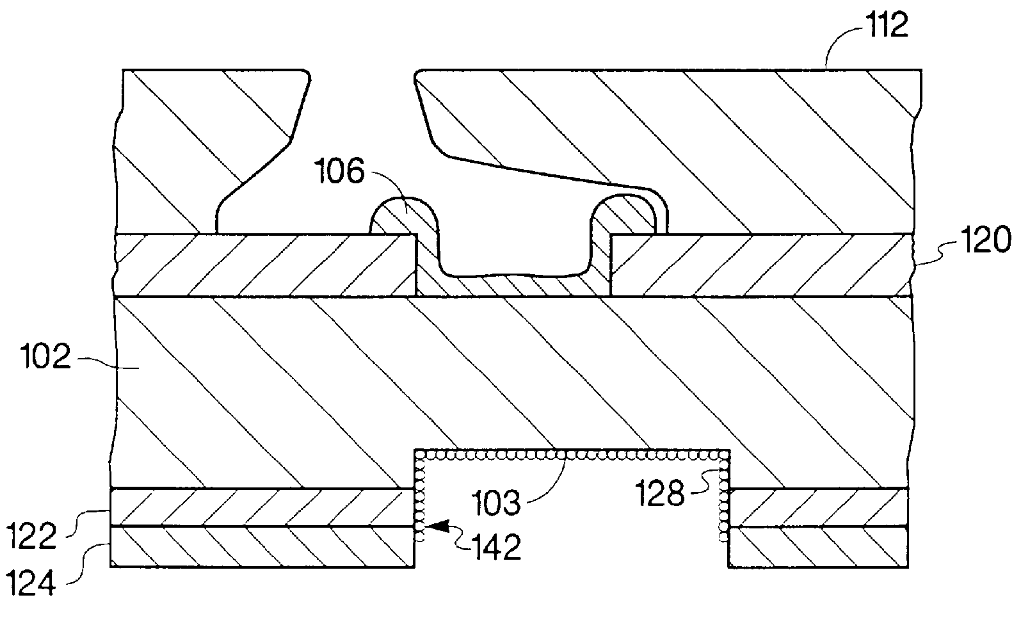
Figure 4C:
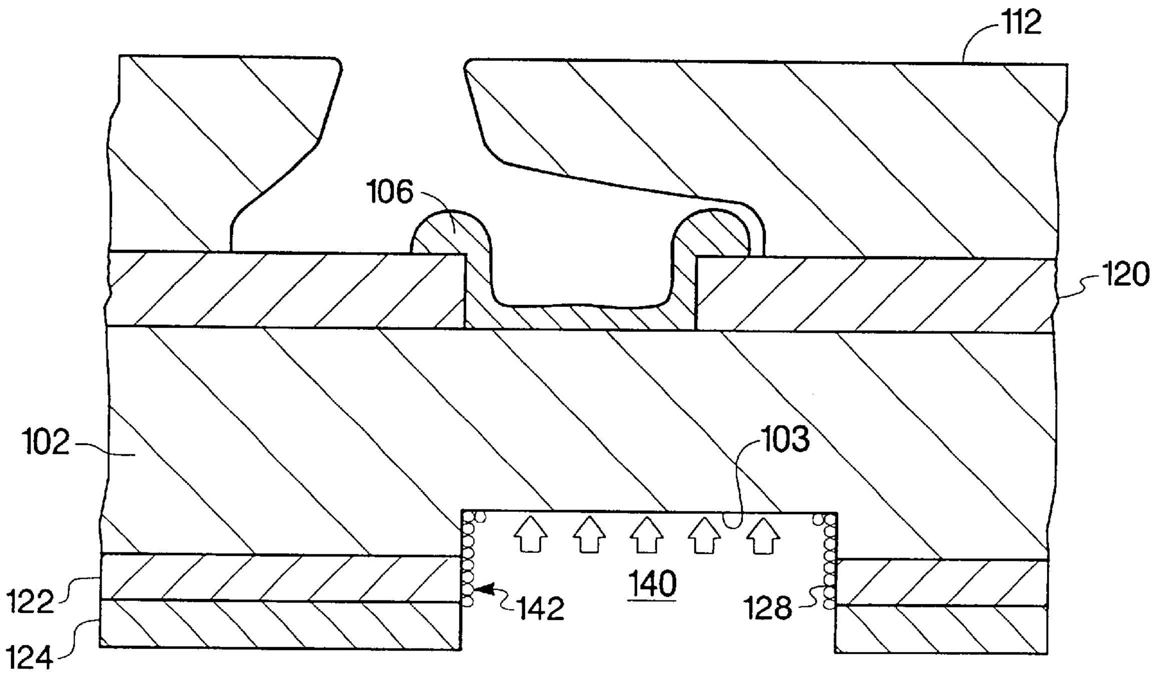

In the embodiment described in the flow chart of FIG. 3A at step 270, the slot 126 through the substrate is formed by an alternating coating etch (or dep-etch process) as illustrated in FIGS. 4A to 4C and described below. The slot or trench 126 is etched from the back side of the substrate starting at the exposed area (the area not masked by the back side mask). FIG. 4A illustrates etchant 140 directed towards the exposed area of the substrate and partially forming the slot.

The etchant 140 is any anisotropic etchant as known by one skilled in the art, that is used in, for example, a TMDE mode, an ECR mode, and/or an RIE mode. The etchant 140 is one used with a dry etch and/or a wet etch. In a particular embodiment, reactive etching gas creates a fluorine radical and electrically charged particles from $SF_6$ forming volatile $SiF_x$. The radical chemically and/or physically etches the substrate to physically remove the substrate material. In a particular embodiment, the $SF_6$ is mixed with one of argon, oxygen, and nitrogen. The etchant 140 is directed towards the substrate for a pre-determined amount of time.

In the dep-etch process, a layer or coating 142 is deposited on inside surfaces of the forming trench, including the sidewalls 128 and bottom 103, as shown in FIG. 4B. In a particular embodiment, the coating 142 is selective to the etchant 140 or is a passivation layer or forms a temporary etch stop, as described in more detail below. In another particular embodiment, the material for the coating 142 is at least one of a polymer, a metal, such as aluminum, an oxide, a metal oxide, and a metal nitride, such as aluminum nitride.

In one particular embodiment, the layer 142 is created by using carbon-fluorine gas to form a polymer on the inside surfaces of the forming trench. In a more particular embodiment, the carbon-fluorine gas creates $(CF_2)_n$, a Teflon-like material or Teflon-producing monomer, on these surfaces. In another particular embodiment, the polymer substantially prevents etching of the sidewalls during the subsequent etch(es).

In a particular embodiment of the alternating coating etch, the gasses for the etchant 140 of the trench etching step alternate with the gasses for forming the coating 142 on the inside of the trench in the coating step. In a more particular embodiment of the alternating process, there is a change from $SF_6$ to a gas that forms the coating 142 on the inside surfaces of the trench, and then back again to the $SF_6$. Therefore, the etchant 140 is again directed towards the bottom surface of the partially etched trench for a pre-determined amount of time, as shown in FIG. 4C. The ions are directed towards the bottom surface of the trench and physically and/or chemically remove the coating 142 along the bottom surface 103, as well as the substrate material adjacent or underneath the bottom surface.

In a particular embodiment, the ions break through the coating 142 on the bottom surface within a few seconds, depending upon how much coating 142 is deposited. However, during the etch, the coating 142 along the sidewalls 128 remains substantially intact during the etching step. Generally, the coated side walls 128 etch at a slower rate than the directly hit bottom surface 103. The coating 142 on the sidewalls, as well as the purposeful direction of the etchants towards the bottom surface, substantially keeps the sidewalls from being etched. In a particular embodiment, this method results in near vertical sidewalls, however other embodiments are also possible, for example, those described in more detail below.

In a more particular embodiment, the etching and deposition steps alternate repeatedly until the slot is formed. The duration of each etch and deposition step ranges from about 1 to 15 seconds. In a particular embodiment, time to deposit the coating 142 each time is about 5 seconds, while etch time is about 6 to 10 seconds and can vary therebetween in the same slot forming process.

Figure 5A:
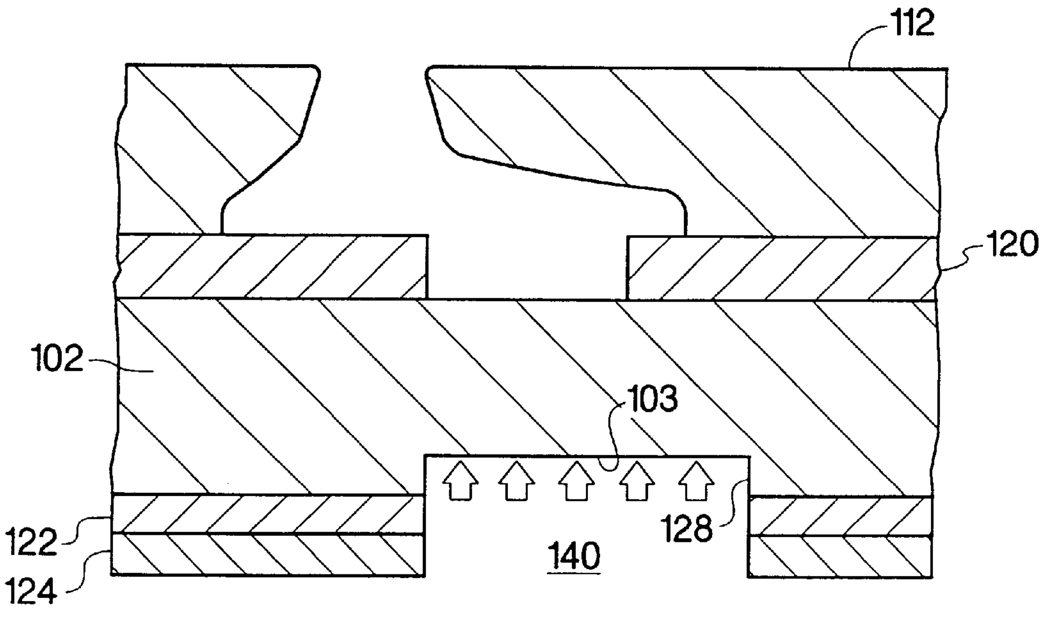
FIGS. 5A to 5E illustrate steps of forming the slotted substrate according to the process described in FIG. 3B.
Figure 5B:
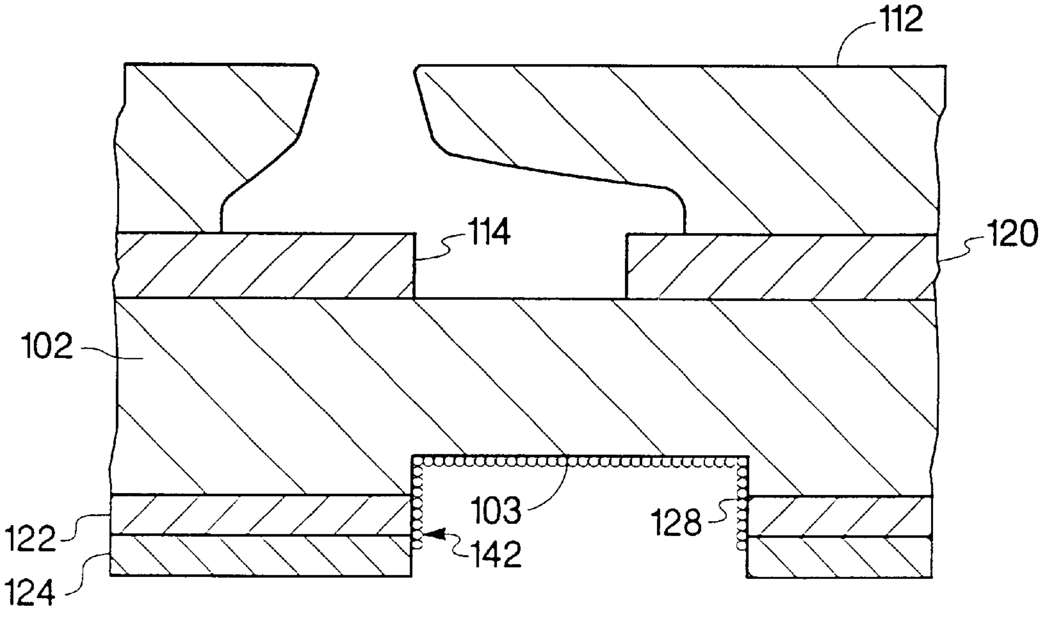
Figure 5C:
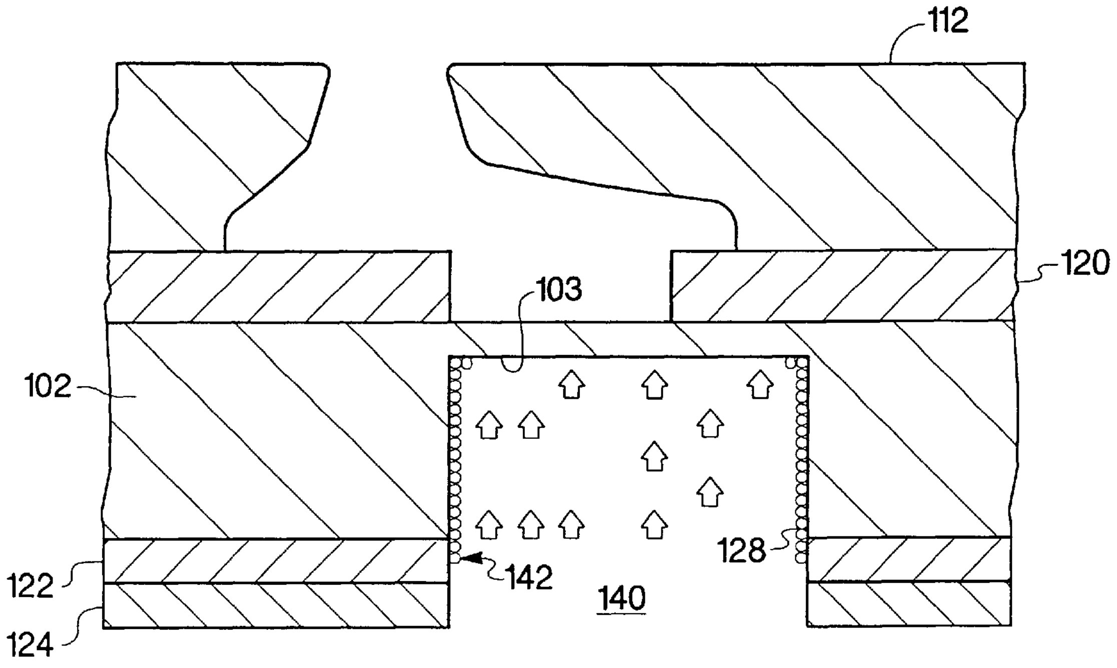
Figure 5D:
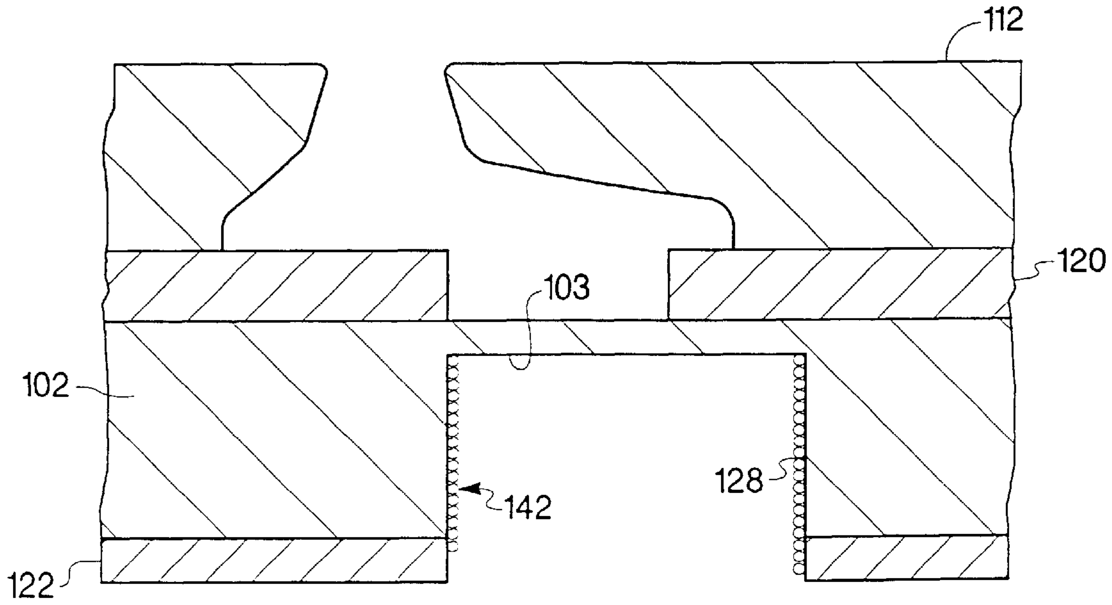
Figure 5E:
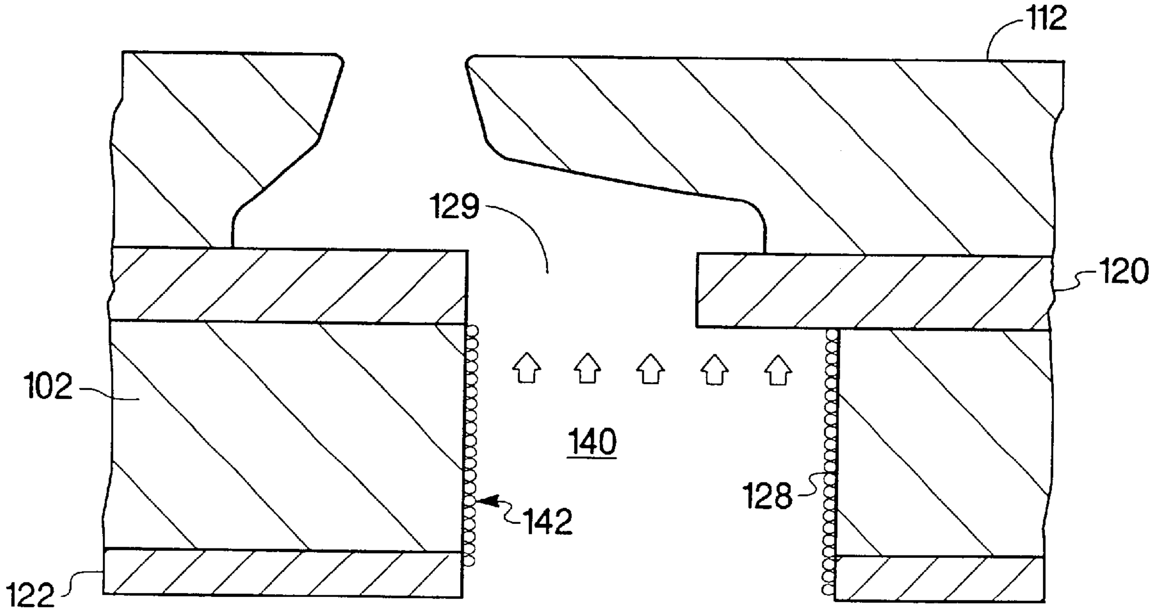

In one particular embodiment, the coating 142 (for example, fluorocarbon residue, as in the case of a polymer coating) has a thickness of less than 100 angstroms along the sidewalls 128 after etching is complete and the slot is substantially formed, as shown in FIG. 5E. In a more particular embodiment, the coating 142 has a thickness of about 50 angstroms. In another particular embodiment, the coated side walls 128 decreases coating thickness at greater depths. This is the case especially if the etching step is longer than desired between coating forming steps. In the embodiment described with respect to FIGS. 4A to 4C, the bottom surface 103 of the trench is etched about 1 to 5 microns between coating forming steps. In this embodiment, the etch rate varies from about 3 to 20 microns/minute depending on various factors. The average is about 11 microns/minute.

In a particular embodiment, during the dep-etch process, the wafer is heated to about 40° C. The dep-etch process (also known as deep reactive ion etching, DRIE process or anisotropic plasma etching), generally does not significantly etch the back side mask. In another embodiment, the fluorine ion energies are between 1 and 40 eV, although higher energies can be achieved. In a particular embodiment, the flow of carbon fluorine gas is in a range from about 1 to 500 sccm, or about 300 sccm. In another embodiment, the flow of etchant $SF_6$ is in a range from about 75 to 400 sccm, or about 250 sccm. In a particular embodiment, for a wafer having a thickness of approximately 625 microns, the slot through the wafer is substantially formed in about 20 minutes to 6 hours, depending upon the tools used, the substrate used, and other factors.

In the embodiment described with regard to FIGS. 4A to 4C, the gas of carbon-fluorine is one of $C_2F_4$, $C_2H_2F_2$, $C_4F_8$, Trifluoromethane $CHF_3$ and argon, perfluorinated aromatic substances such as perfluorinated, styrene-like monomers or ether-like fluorine compounds, and mixtures thereto. In the embodiment described, the etchant 140 is one of common etching gases that release fluorine, nitrogen trifluoride $NF_3$ or tetrafluoromethane $CF_4$ or mixtures thereof.

In the embodiment described in the flow chart of FIG. 3A at steps 280 and 290, the photoimagable material 124 is removed by ashing, and the FSP layer 106 is removed with an etch, after the slot is substantially formed in step 270. In this embodiment, ashing of the photoimagable material takes place before the FSP layer 106 is removed, and in so doing, damage to and/or delamination of the barrier layer 112 is likely to be avoided or minimized due to the ash. In this embodiment, the FSP layer is removed with a buffered oxide etch (BOE) in step 290. Often, the BOE is a mix of hydrofluoric acid and ammonium fluoride. The etch is aqueous and may be any mixture strength of the two primary ingredients. In another embodiment, a dry etch is used to remove the FSP layer. In this embodiment, no further etching of the slot occurs after removal of 280 and 290.

Figure 3B:
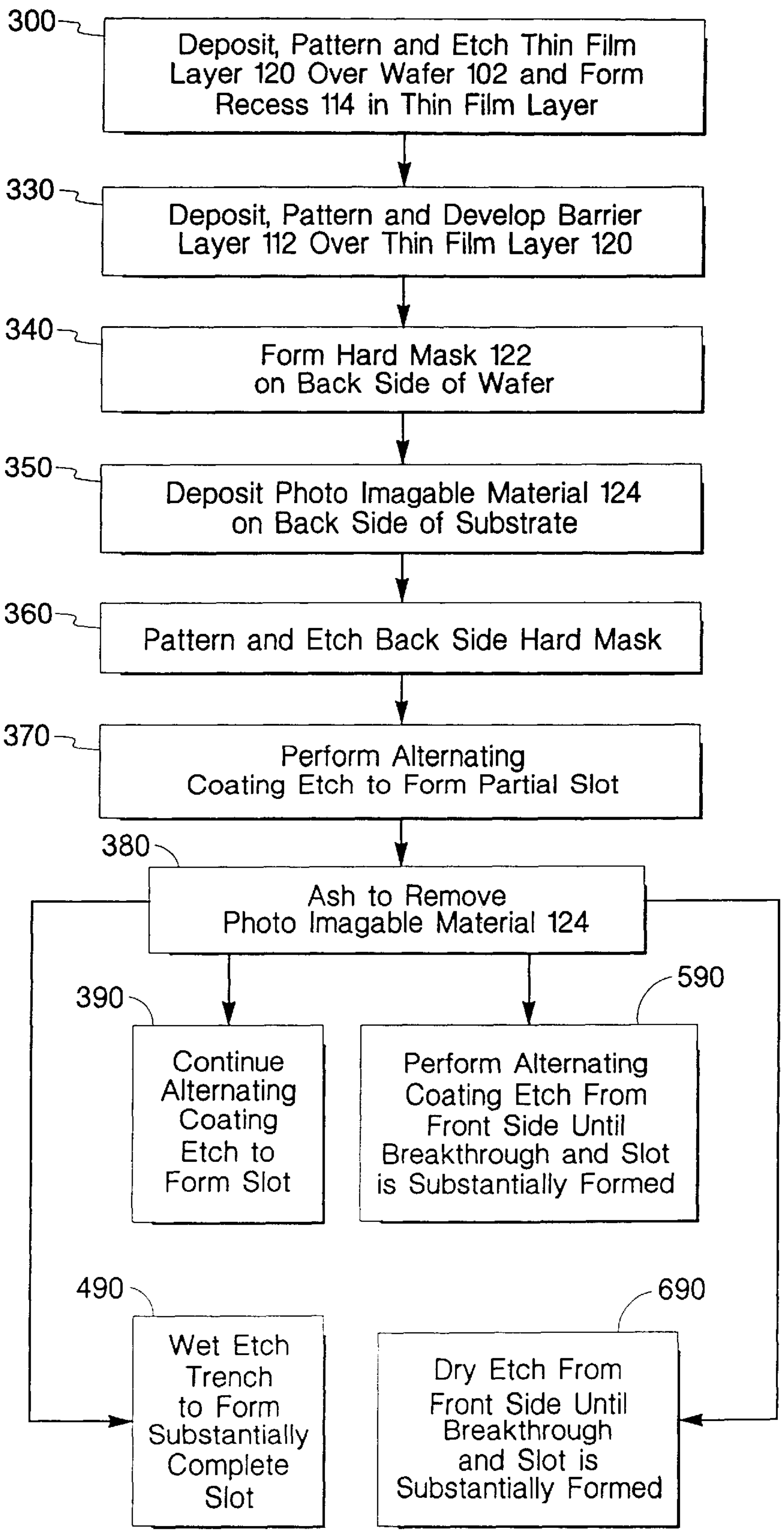

In the embodiment described in the flow chart of FIG. 3B, the steps 300, and 330 to 380 correspond to steps 200, and 230 to 280. The difference between FIGS. 3A and 3B is that in FIG. 3B, there is no FSP layer 106. FIGS. 5A to 5E illustrate etching of the bottom surface 103 and sidewalls 128 of the slot, as outlined in the flow chart of FIG. 3B. In this embodiment, to protect the thin film layer 120 and the barrier layer 112 from the ash to remove the photoimagable material, the trench or slot is partially formed, as shown in FIGS. 5A to 5C. The photoimagable material is then removed, as shown in FIG. 5D, and then the slot is completed, as shown in FIG. 5E. (Again, the layer 112 is not present in some embodiments, depending upon the application. In another embodiment, additional layers are deposited over the substrate after the slot is formed, depending upon the application.) As shown in FIG. 5D, the hard mask 122 remains on the back side to protect that side of the substrate from subsequent etching.

In this embodiment, the slot is formed in the substrate from the back side to about 300 to 600 microns towards the front side when the etch step 370 is completed, and the ash step 380 is commenced. In another embodiment, the slot is formed to at least half way through the wafer at this step. A disadvantage of the method of FIG. 3B is that there is an interruption in slot formation, and therefore slot formation takes additional time.

As shown in FIG. 5E, after the ash step 380 is completed, the slot is then etched to completion through the substrate, utilizing at least one of a variety of different methods. In a particular embodiment, the dep-etch process is continued as described at step 390. In another embodiment, the slot is completed with a wet etch as described at step 490, and shown in FIGS. 12 and 13 (which are described in more detail later). In yet another embodiment, the slot is completed with the dep-etch process from the front side of the substrate as described at step 590. For step 590, in the embodiment having the barrier layer 112, the layer 112 may have to be formed after the slot is completed. In yet another embodiment, the slot is completed with a dry etch from the front side of the substrate as described at step 690. In another embodiment, not shown, the slot is completed with a dry etch from the back side.

Figure 3C:
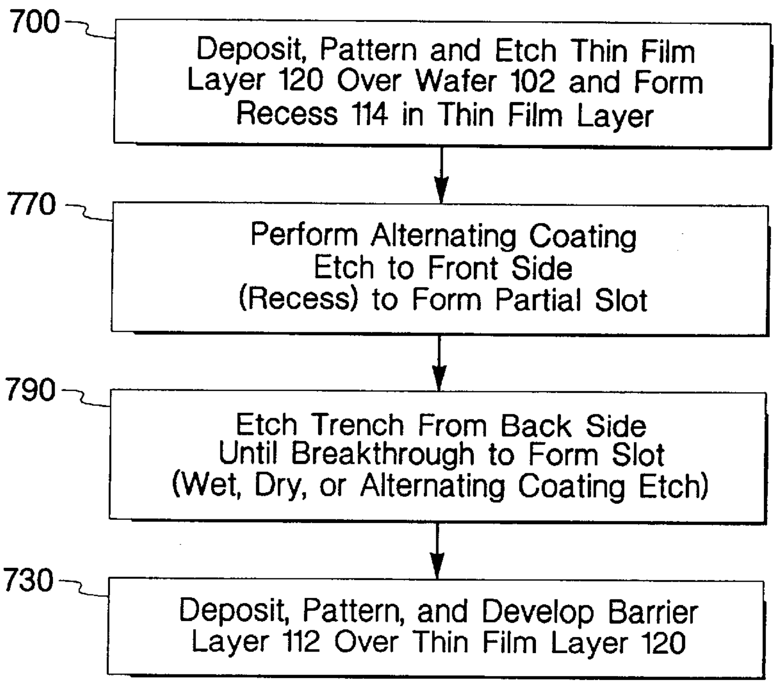

In the embodiment described in the flow chart of FIG. 3C, the coated substrate is formed at step 700. The slot in the substrate is formed by first using the dep-etch process method from the front side of the substrate, at step 770, to form a recess. At step 790, the substrate is then etched from the back side to form the slot therethrough. The back side etch may be completed utilizing at least one of a variety of different methods. In alternating embodiments, the back side etch is one of a wet etch, a dry etch, and the dep-etch process. In this embodiment, at step 730, the layer 112 is formed over the layer 120 after the slot is formed.

Figure 3D:
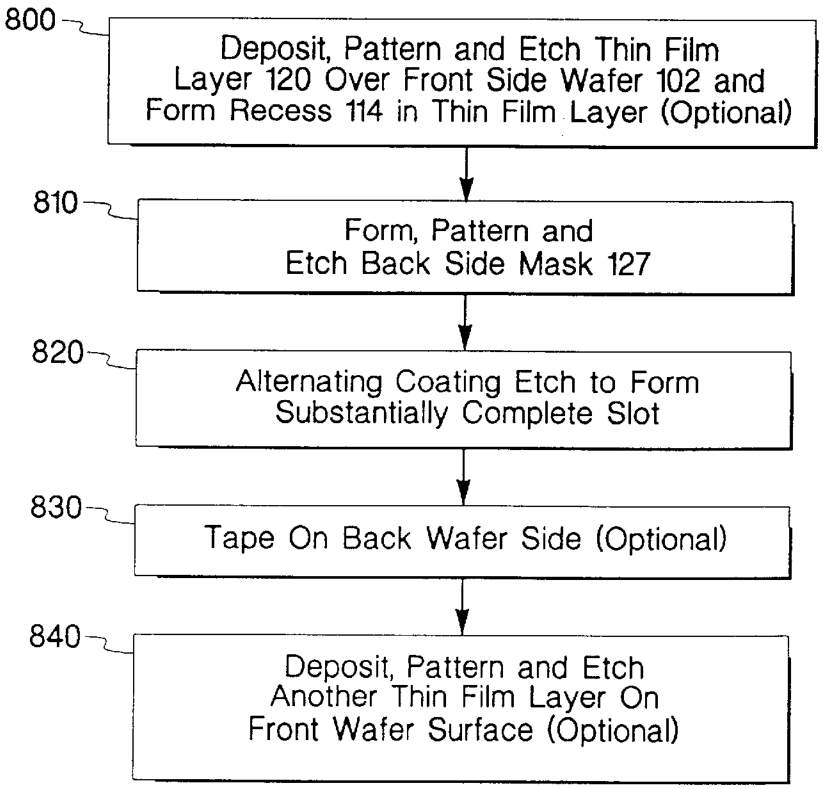
Figure 6A:
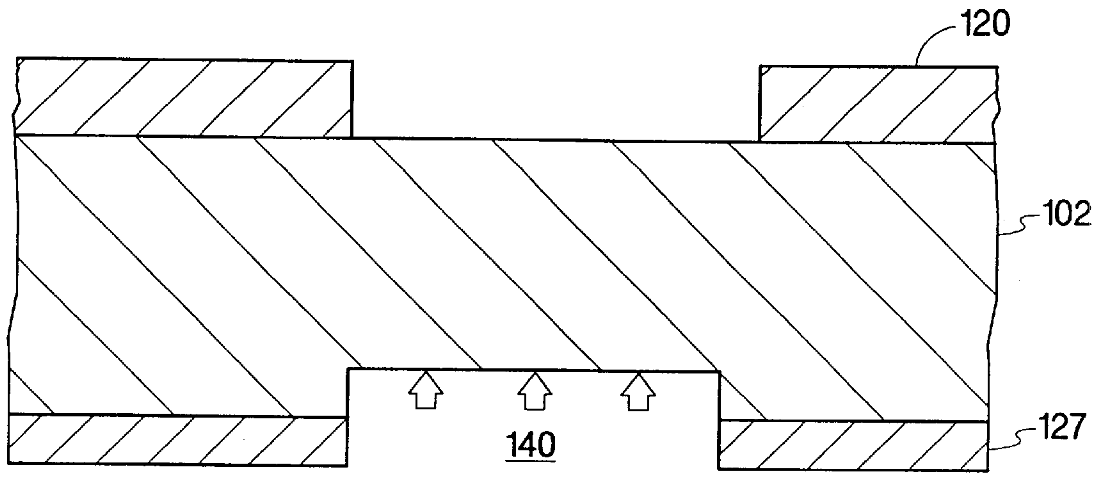
FIGS. 6A to 6D illustrate steps of forming the slotted substrate according to the process described in FIGS. 3D and 3E.

In one embodiment described at steps 800 and 810 in the flow chart of FIG. 3D and illustrated in FIG. 6A, a thin film layer 120 is formed or deposited on a front side of the substrate 102, and a back side mask 127 is formed or deposited on the back side of the substrate. In a particular embodiment, both the layer 120 and the layer 127 are deposited, patterned and etched at substantially the same time. In an alternative embodiment, they are deposited, patterned and etched sequentially. The layers 120 and 127 may function as masks to protect and cover the substrate from etchants. In alternative embodiments, the layer 127 and/or the layer 120 is comprised of at least one of thermal oxide, deposited film which is selective to the etch, photoimagable material, and barrier material. In other alternative embodiments (not shown), the substrate is not masked/coated with additional layers, or is only coated/masked on one side of the substrate, for example, either layer 127 or layer 120 is formed.

Figure 6B:
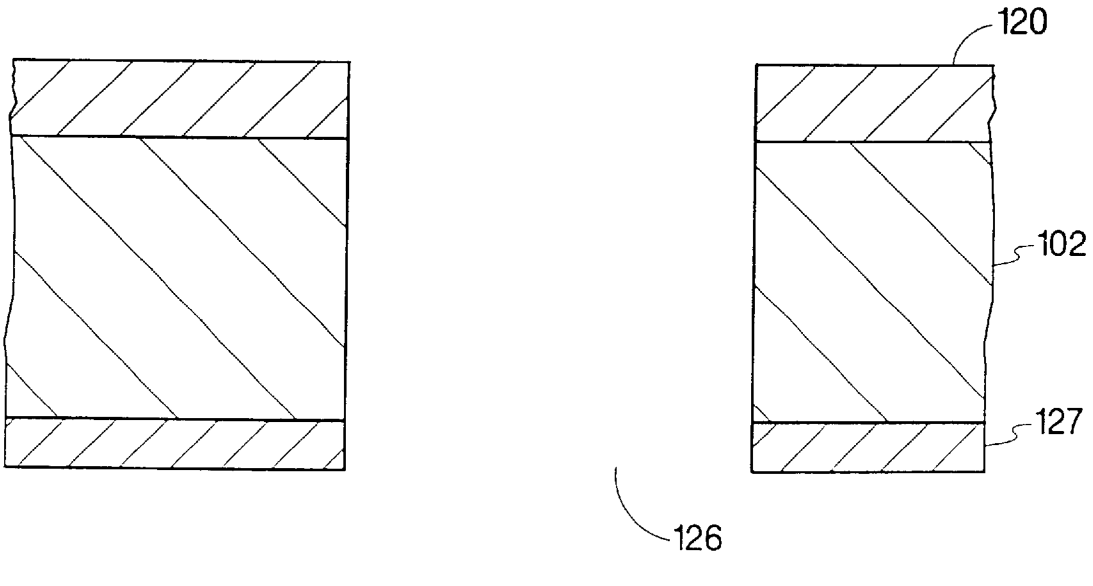
Figure 6C:
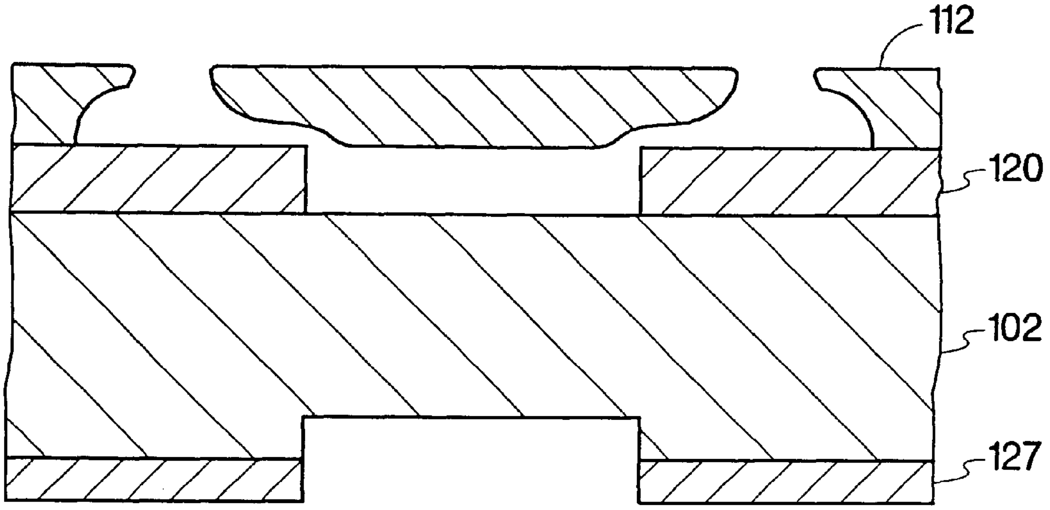
Figure 6D:
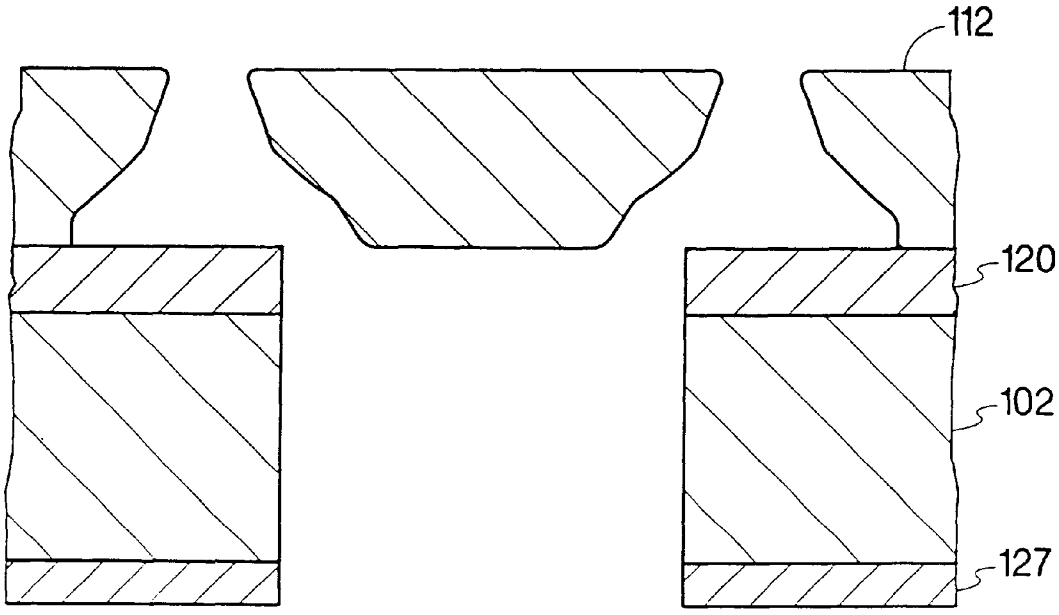

As shown in FIG. 6B, and described in step 820, the slot 126 is etched through the wafer using the dep-etch process described herein. In one embodiment, as described in step 830, the back side is taped for protection during handling after the through wafer etching. In step 840, another thin film layer (in this case, layer 112) is deposited, patterned and etched, as shown in FIG. 6D.

Figure 3E:
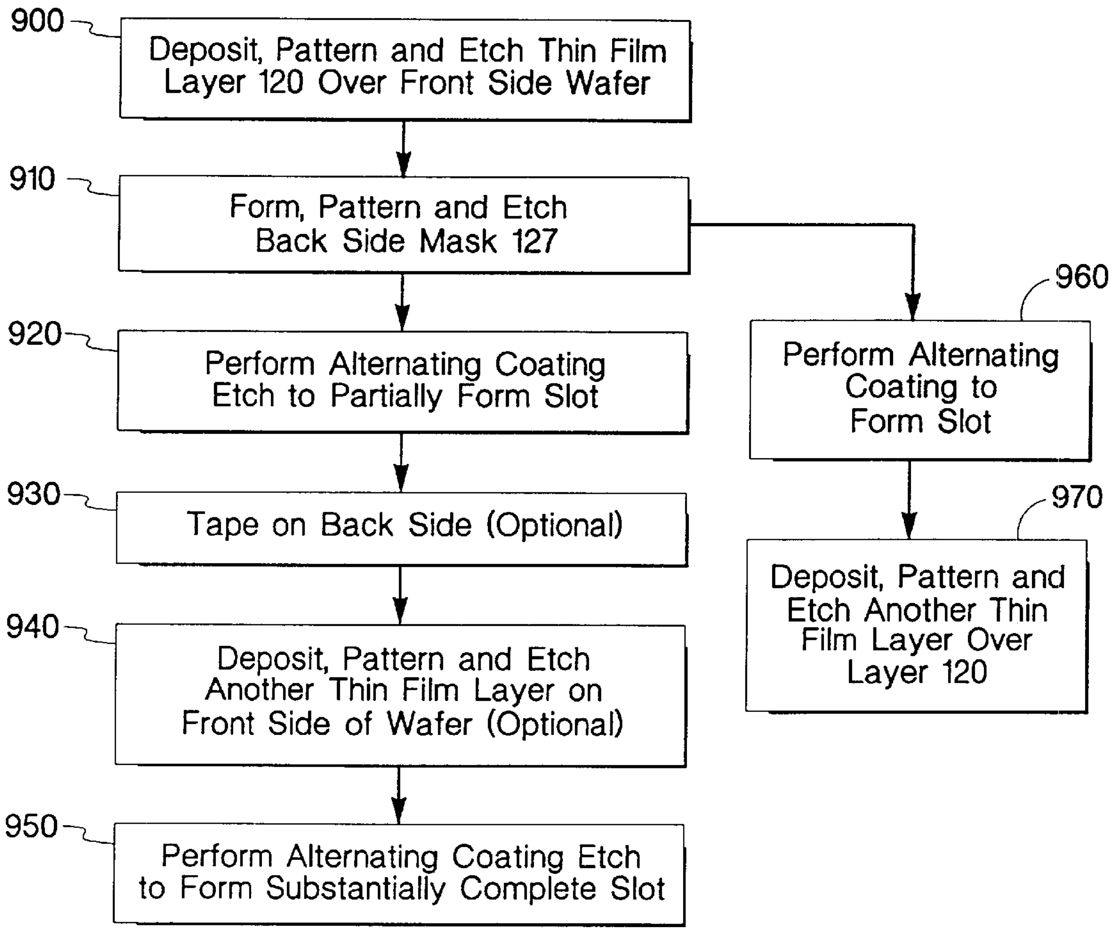

In one embodiment described at steps 900 and 910 in the flow chart of FIG. 3E and also illustrated in FIG. 6A, a thin film layer 120 is formed or deposited on a front side of the substrate 102, and a back side mask 127 is formed or deposited on the back side of the substrate, similarly to FIG. 3D.

As shown in FIG. 6A, and described in step 920, the slot 126 is partially etched through the wafer using the dep-etch process described herein. In one embodiment, as described in step 930, the back side of the substrate is taped to protect the wafer during handling. In step 940, another thin film layer (in this case, layer 112) is deposited, patterned and etched, as shown in FIG. 6C. As shown in FIG. 6D, and described in step 950, the slot 126 is substantially completely etched through the wafer using the dep-etch process described herein. In an alternative embodiment, after the back side mask step 910, step 960 (performing alternating coating to form slot) takes place. Then, in step 970, another thin film layer is deposited over layer 120, patterned and etched.

Figure 7A:
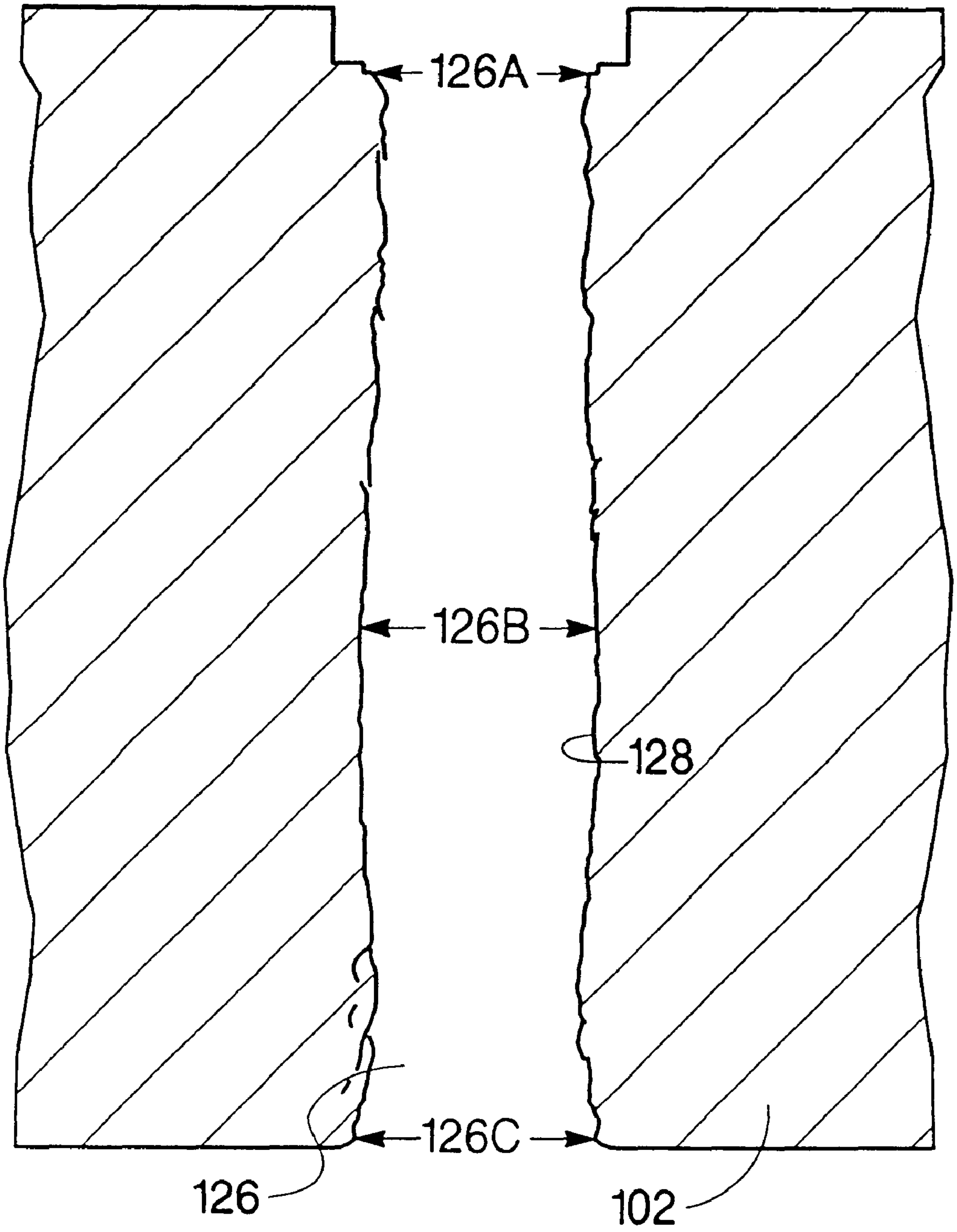
FIG. 7A illustrates one embodiment of a slotted substrate formed by a process of the present invention.

FIG. 7A illustrates a slot 126 formed by one of the processes described above. The slot 126 illustrated here is substantially bowed. The slot has a top width 126*a* of about 119 microns. A width at a mid-section 126*b* of the slot is about 121 microns, and at a bottom 126*c* is about 118 microns. In another embodiment, the range of widths along a length of the slot is from about 148.5 to about 150.5 microns. In a particular embodiment, along the trench, the width varies along the side walls 128 in a range from about 2 to 6.5%. In another embodiment, the average change in trench width uniformity is about 3.5%. In a particular embodiment, the trench width variability is minimized. In effect, the design flexibility is maximized. With minimized trench width, the die fragility is minimized, and the die yield is maximized. In yet another embodiment, the slot or trench 126 has a substantially constant width. The substantially constant width is in a range of about 50 to 155 microns, depending upon the application.

In an alternative embodiment, a width of the recess 114 corresponds to the top width 126*a* of the slot. The recess width ranges from about 30 to 250 microns, depending upon the substrate and processes used. In a particular embodiment, the recess 114 width is about 80 microns.

Figure 7B:
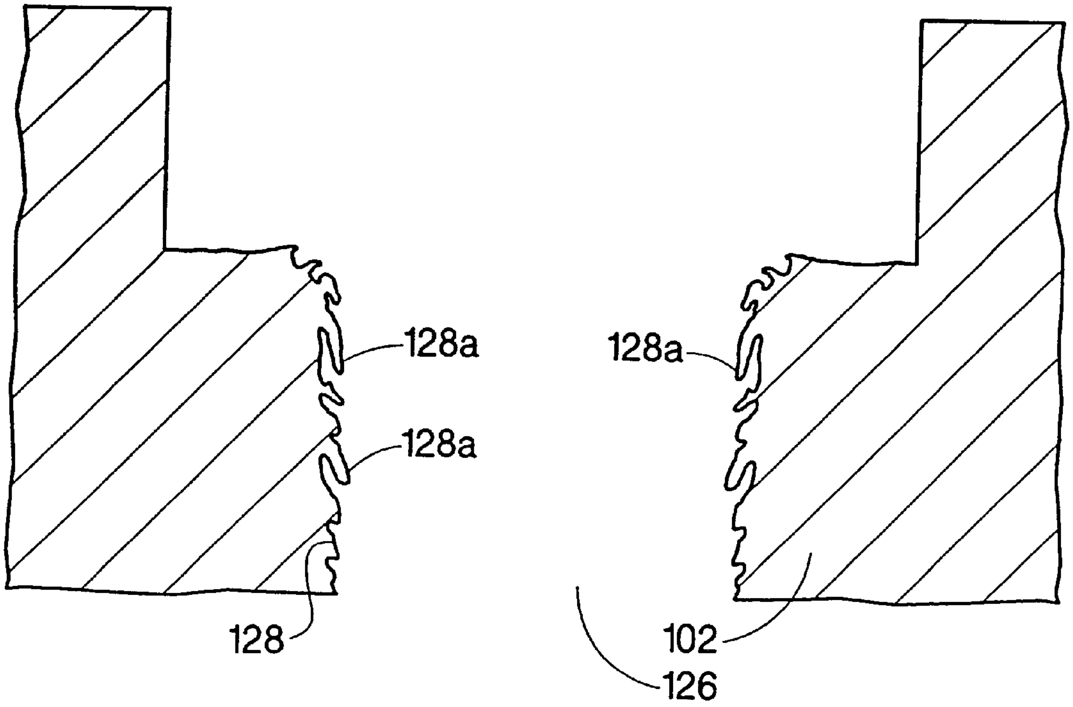
FIG. 7B illustrates an expanded view of the slotted substrate of FIG. 7A.

FIG. 7B is a close up of one embodiment of FIG. 6A. The side wall 128 has projections 128*a*. In a particular embodiment, the roughness of the side walls 128, the projections 128*a*, is about 1 to 3 microns. In this particular embodiment, projections are in the direction of the etchant flow, which are generally substantially parallel with the slot. In another embodiment (not shown), the projections are not substantially parallel with the slot and may even be perpendicular with the slot.

Figure 8:
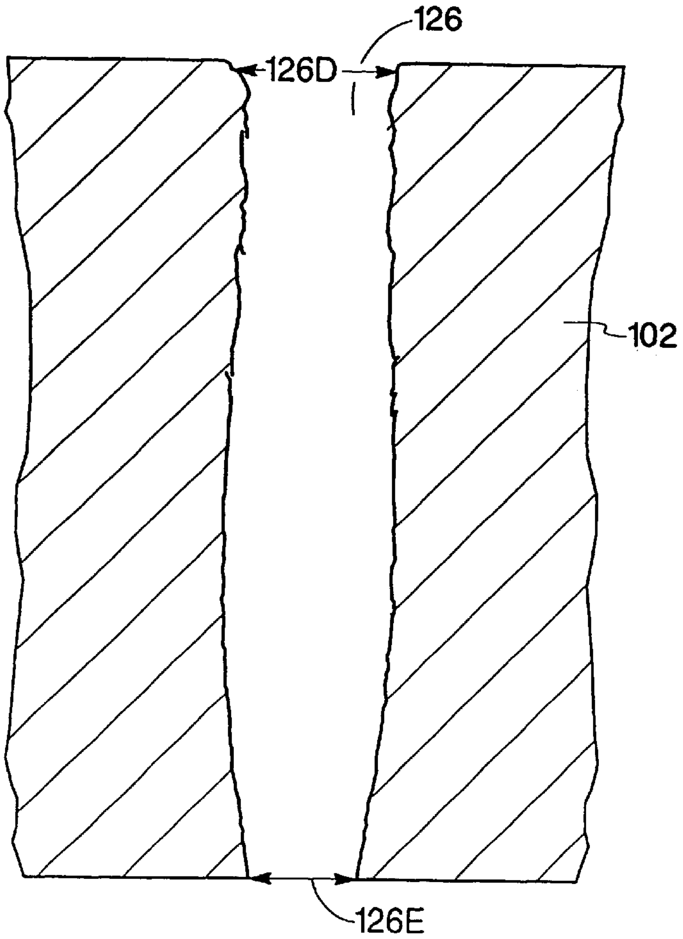
FIG. 8 illustrates another embodiment of the slotted substrate formed by the process of the present invention.

In an embodiment illustrated in FIG. 8, the slot width at the top 126*d* is about 144.5 microns, whereas the width at the bottom 126*e* is about 106.5 microns. In this embodiment, the bottom has the smallest width of the slot, while bulging slightly in the mid-section. In this embodiment, the slot 126 is substantially bowed.

Figure 9:
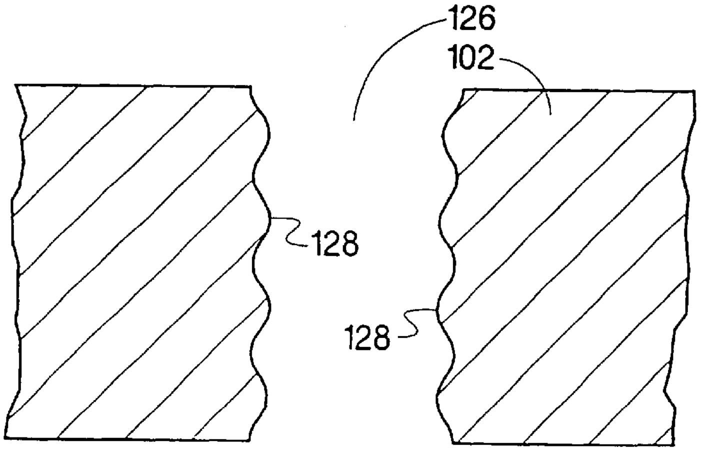
FIG. 9 illustrates yet another embodiment of the slotted substrate formed by the process of the present invention.

In an embodiment illustrated in FIG. 9, the slot has sidewalls 128 that are scalloped. In the embodiment shown, the scallops are fairly symmetrical and represent changes in the process, as factors affecting etching are compensated for.

Figure 10:
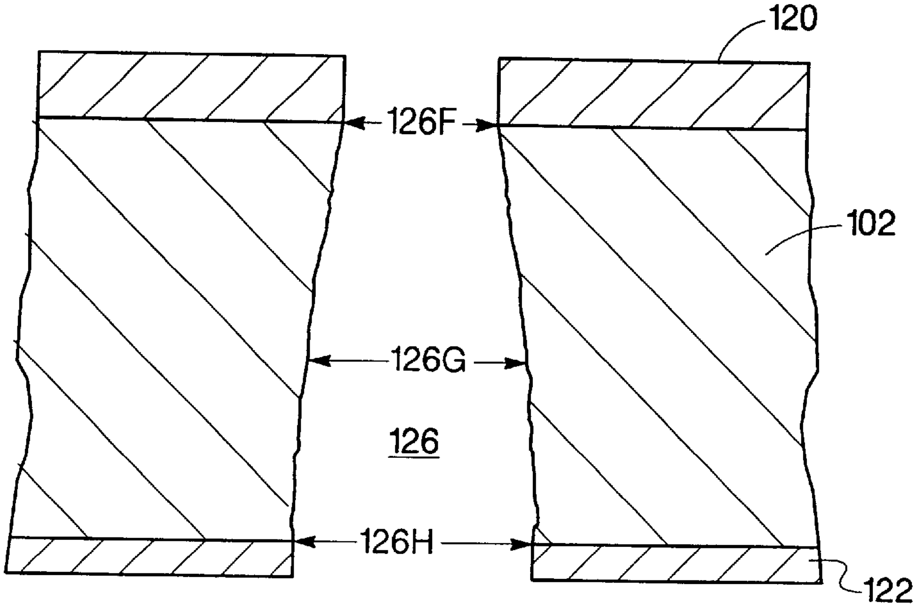
FIG. 10 illustrates an alternative embodiment of the slotted substrate formed by the process of the present invention.

In the embodiment of the positively tapered slot profile of FIG. 10, a width of the slot 126 tapers toward the recess 114 at the front side of the substrate. In a particular embodiment, a top width 126*f* is about 50 microns, a width at a mid-section 126*g* is about 69 microns, and a bottom width 126*h* is about 81 microns. In this illustrated embodiment, the bottom width and the tapered slot has a significantly smaller area than a wet etched slot. The slot tapers through the substrate with taper angles that range up to about 25 degrees.

Figure 11:
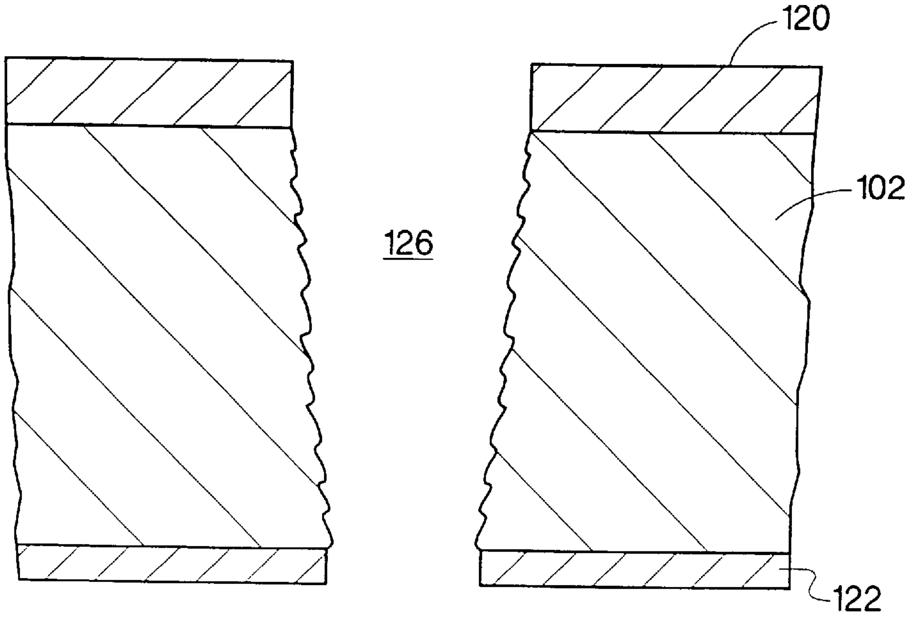
FIG. 11 illustrates another alternative embodiment of the slotted substrate formed by the process of the present invention.

In the embodiment of the reentrant slot profile of FIG. 11, a width of the slot 126 tapers toward the back side of the substrate. In a particular embodiment, measurements of bottom and top widths correspond respectively to top and bottom widths of FIG. 10. In alternative embodiments, the tapered sidewalls 128 of FIGS. 10 and 11 are one of substantially straight (shown in FIG. 10), scalloped (FIG. 11), jagged (shown in FIG. 11) or curved (FIG. 8).

Figure 12:
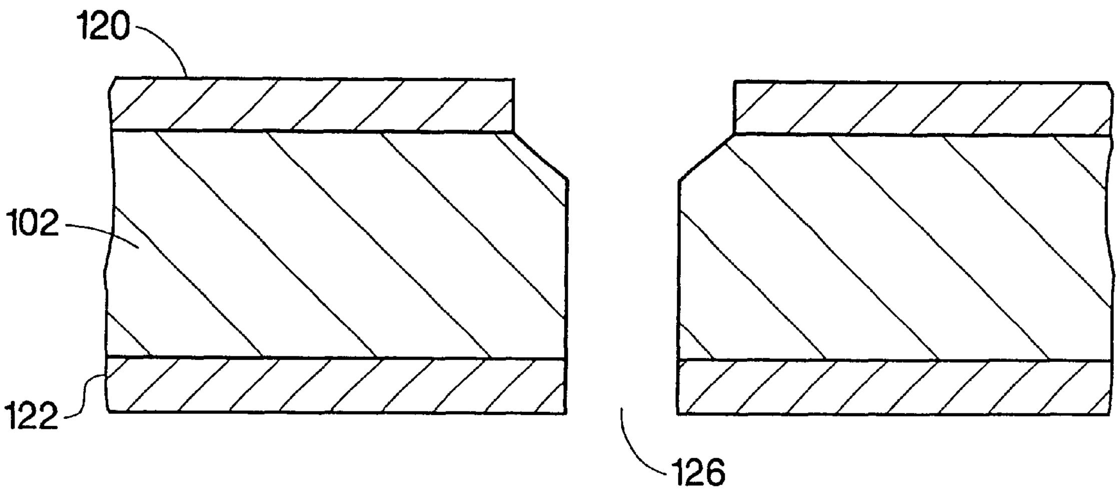
FIG. 12 illustrates one embodiment of the slotted substrate according to one of the processes described in FIG. 3B.
Figure 13:
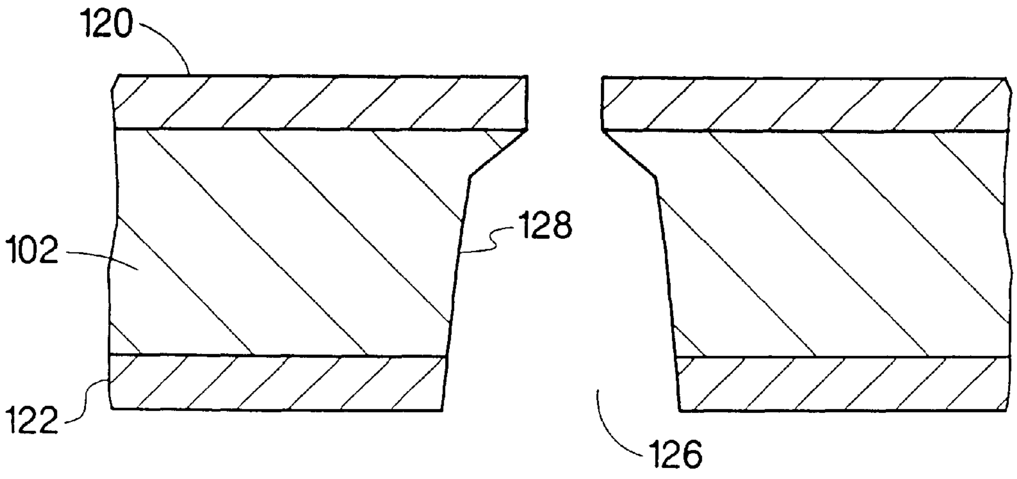
FIG. 13 illustrates an alternative embodiment of the slotted substrate according to one of the processes described in FIG. 3B.

In the embodiment of FIGS. 12 and 13, the slot is partially formed as described in FIG. 3B up to step 380, and then the step 490 is performed. The step 490 includes wet etching the remainder of the substrate to form the substantially complete slot. In one embodiment, the substrate used is a (100) silicon substrate. In another embodiment (not shown), the substrate used is a (110) silicon substrate.

In FIG. 12, the slot 126 formed at step 380 has a width that is less than the width of the recess 114 (or channel 129) formed in the thin film layer 120. As a result, when the wet etch occurs the slot opens up to edges of the thin film layer 120. In the embodiment illustrated, the walls 128 adjacent the back side of the substrate, which are formed in step 370 (the dep-etch process), are substantially straight; while the walls adjacent the front side are tapered. However, the walls 128 may be one of straight, scalloped, jagged, tapered, curved, or a combination thereof in alternative embodiments.

In FIG. 13, the slot 126 formed at step 380 has a width that is greater than the width of the recess 114 (or channel 129) formed in the thin film layer 120. As a result, when the wet etch occurs the slot tapers inwards towards the edges of the thin film layer 120. In this illustrated embodiment, the walls 128 adjacent the back side of the substrate, which are formed in step 370 (the dep-etch process), are substantially tapered, as described with respect to FIG. 10; while the walls adjacent the front side are tapered. Again, however, the walls 128 may be one of straight, scalloped, jagged, tapered, curved, or a combination thereof in alternative embodiments. For example, the walls adjacent the back side are formed by the dep-etch process and are substantially straight, and the walls adjacent the front side are formed by the wet etch and are substantially straight.

Figure 14:
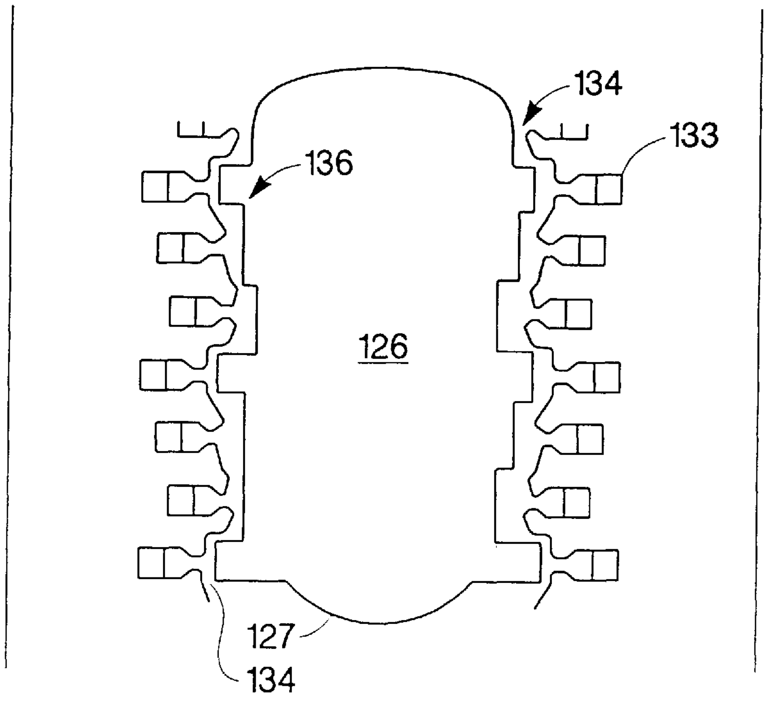
FIG. 14 illustrates a front side view of an embodiment of a shelf taken from section 14—14 of FIG. 2A.

FIG. 14 illustrates a schematic plan view through section 14—14 of FIG. 2A. In FIG. 14, there is a shelf 134 between the slot 126 and resistors 133. In the embodiment shown, end edges 127 of the shelf 134 are rounded along ends of the slot 126, while side edges 136 of the shelf 134 are substantially jagged. The jagged shelf edges 136 substantially follow the jaggedly positioned resistors 133 along the substrate. In a particular embodiment, the distance from the slot edge to the resistor remains substantially constant along the edge 136. In the embodiment shown, the jagged shelf edges 136 and/or rounded end edges 127 are formed by patterning and etching the back side mask 122 to have a shape that substantially mirrors the shape of the shelf edges 127, 136 on the front side. In this embodiment, the dep-etch process described herein is performed to the back side and the pattern of the back side masking layers is transmitted to the front side. In a particular embodiment, the etch rate is slowed down to obtain greater shelf edge control.

In an alternative embodiment, the front side of the substrate in FIG. 14 has a mask formed, patterned and etched thereon. In this embodiment, the mask corresponds to the shape of the shelf edges 127, 136 shown in FIG. 14. The front side is etched with the dep-etch process described herein. In an alternative embodiment, etching from the front side partially forms the slot, and etching from the back side completes the slot.

In one embodiment of the above illustrated embodiments, the substrate 102 is a monocrystalline silicon wafer. In a particular embodiment the substrate has a low BDD (Bulk Defect Density which is a low number of imperfections in the silicon crystal lattice or is also a reduced amount of oxide precipitants). However, using some of the etching processes described above, the slot is formed substantially as vertically or accurately with or without starting with a low BDD substrate. In a particular embodiment, the wafer has approximately 100 to 700 microns of thickness for a given diameter, for example, a four, six, eight, or twelve inch diameter.

In one embodiment, the thin film stack 120 illustrated and described in FIGS. 3 through 5 has each of the layers (104, 107, 108, 110, 111, and 112) shown in FIG. 2A. In this embodiment, the substrate 102 is formed for the printhead 14 in the print or inkjet cartridge 10. In a particular embodiment, the capping layer 104 is composed of field oxide. In another particular embodiment, the FSP layer 106 is composed of a deposited oxide gas. In another embodiment, the FSP layer 106 and the layer 104 is comprised of the same material. In additional alternative embodiments, the barrier layer 112 may be composed of at least one of a fast cross-linking polymer such as photoimagable epoxy (such as SU8 developed by IBM), photoimagable polymer or photosensitive silicone dielectrics, such as SINR-3010 manufactured by ShinEtsu™, or an organic polymer plastic which is substantially inert to the corrosive action of ink.

It is therefore to be understood that this invention may be practiced otherwise than as specifically described. For example, the present invention is not limited to thermally actuated printheads, but may also include, for example, mechanically actuated printheads, as well as other applications having micro-fluidic channels through a substrate, such as medical devices. In addition, the present invention is not limited to printheads, but is applicable to any slotted substrates. Thus, the present embodiments of the invention should be considered in all respects as illustrative and not restrictive, the scope of the invention to be indicated by the appended claims rather than the foregoing description.

What is claimed is:

1. A method of etching a fluid feed slot comprising:

etching an exposed section on a first surface of a substrate;

coating the etched section of the substrate; and alternatingly repeating the etching and the coating until the fluid feed slot through the substrate is formed.

2. The method of claim 1 further comprising forming active layers on the first surface.

3. The method of claim 1 wherein the etching includes anisotropic etching.

4. The method of claim 3 wherein the etching includes a dry etch.

5. The method of claim 4 wherein the etching includes a wet etch.

6. The method of claim 1 wherein the exposed section forms inside surfaces of the substrate, and the inside surfaces are coated with the coating.

7. The method of claim 1 wherein the coating includes coating the etched section of the substrate with a layer selective to an etchant used in the etching.

8. The method of claim 1 wherein the coating includes coating the etched section of the substrate with a polymer.

9. The method of claim 1 wherein the coating includes coating the etched section of the substrate with an oxide.

10. The method of claim 1 wherein the coating includes coating the etched section of the substrate with a metal.

11. The method of claim 1 wherein the coating includes coating the etched section of the substrate with a metal nitride.

12. The method of claim 1 wherein the coating includes coating the etched section of the substrate with a metal oxide.

13. A method of manufacturing a micro-fluidic channel in a substrate comprising:

etching an exposed section on a first surface of the substrate;

forming a temporary etch stop along the etched section of the substrate; and alternatingly repeating the etching and the forming until the micro-fluidic channel is formed through the substrate.

14. The method of claim 13 wherein the exposed section of the substrate has inside surfaces upon which the temporary etch stop is formed.

15. The method of claim 14 wherein the inside surfaces include a bottom surface and side walls, wherein the temporary etch stop on the bottom surface is removed more quickly, due to the etching, than the removal of the temporary etch stop from the side walls.

16. The method of claim 13 wherein the duration of each etching and stop forming step ranges from about 1 to 15 seconds.

17. The method of claim 13 further comprising forming active layers on the first surface.

18. The method of claim 13 further comprising forming active layers on a second surface, opposite the first surface, prior to forming the channel.

19. A method of manufacturing a fluid ejection device comprising:

forming a fluid drop generator over a front side of a substrate;

etching an exposed section of a back side, opposite the front side, of the substrate;

coating the etched section of the substrate; and alternatingly repeating the etching and the coating until a slot in the substrate is formed through to the front side.

20. The method of claim 19 further comprising forming a front side protection layer over the front side of the substrate before forming the slotted substrate.

21. The method of claim 20 further comprising removing the front side protection layer after etching is substantially completed to expose the slot through the substrate.

22. The method of claim 21 further comprising forming a back side mask layer before etching the substrate, and removing the back side mask layer before removing the front side protection layer.

23. The method of claim 22 further comprising forming an oxide mask between the back side mask layer and the substrate before etching the substrate, and temporarily interrupting the alternatingly repeating etching and coating steps to remove the back side mask layer.

24. The method of claim 23 wherein the back side mask layer is removed when the slot is etched to about 600 microns deep.

25. The method of claim 19 further comprising forming a back side mask layer before etching the substrate, wherein the back side mask is at least one of thermal oxide, deposited film which is selective to the etch, photoimagable material, and barrier material.

26. The method of claim 19 wherein the fluid drop generator has a resistor formed adjacent a fluid chamber through which fluid is ejected.

27. A method of manufacturing a micro-fluidic channel in a substrate comprising:

dry etching an exposed section of a back side of a substrate to form a recess having inside surfaces;

coating the inside surfaces of the recess;

alternatingly repeating the etching and coating to form a trench from the back side of the substrate; and wet etching the trench until a slot is formed through to a front side of the substrate.

28. The method of claim 27 wherein the trench is less than half way deep through the wafer before the wet etching begins.

29. The method of claim 27 wherein the trench is at least about half way deep through the wafer before the wet etching begins.

30. A method of manufacturing a fluid ejection device comprising:

forming a fluid drop generator over a front side of a substrate;

etching an exposed section of a back side, opposite the front side, of the substrate;

coating the etched section of the substrate;

alternatingly repeating the etching and the coating until a trench is formed in the back side of the substrate; and etching the front side of the substrate until a slot is formed through to the trench, and through the substrate.

31. The method of claim 30 wherein etching the front side includes coating the etched section of the substrate from the front side; and alternatingly repeating the etching and the coating.

32. The method of claim 30 wherein etching the front side includes wet etching.

33. A method of manufacturing a fluid ejection device comprising:

forming a fluid drop generator over a front side of a substrate;

etching an exposed section of the front side of the substrate;

coating the etched section of the substrate;

alternatingly repeating the etching and the coating until a trench is formed in the front side of the substrate; and etching the back side of the substrate in an area opposite the trench until a slot is formed through to the trench, and through the substrate.

34. The method of claim 33 wherein etching the back side includes forming a coating along the etched section of the substrate; and alternatingly repeating the etching step and the coating forming step.

35. The method of claim 33 wherein the fluid drop generator has a plurality of resistors, wherein a shelf upon which fluid flows is formed between slot edges and the plurality of resistors, wherein the slot edges correspond to respective resistor locations.

36. The method of claim 35 wherein a length of the shelf from the slot edges to the respective resistors remains substantially constant along the shelf.

37. A slotted substrate wherein a slot in a substrate is formed by the method of claim 27.

38. The slotted substrate of claim 37 wherein the slot has substantially straight walls.

39. A slotted substrate wherein a slot in a substrate is formed by the method of claim 1.

40. The slotted substrate of claim 39 wherein the slotted substrate has dimensional control with 10 microns.

41. The slotted substrate of claim 39 wherein the slot has substantially bowed walls.

42. The slotted substrate of claim 39 wherein the slot has substantially curved walls.

43. The slotted substrate of claim 39 wherein the slot has substantially straight walls.

44. The slotted substrate of claim 39 wherein the slot is tapered to have a reentrant profile.

45. The slotted substrate of claim 39 wherein the slot has substantially scalloped walls.

46. The slotted substrate of claim 39 wherein the slot has a first section adjacent the first surface of the substrate and a second section adjacent a second surface of the substrate opposite the first surface, wherein the first section is tapered and the second section is substantially straight.

47. The slotted substrate of claim 39 wherein the slot tapers through the substrate with taper angles that range up to about 25 degrees.

48. The slotted substrate of claim 39 wherein the slot has side walls that have projections, wherein the projections range up to about 3 microns.

49. The slotted substrate of claim 48 wherein the projections along the sidewalls are directed towards the front side of the substrate.

50. The slotted substrate of claim 48 wherein the projections along the sidewalls have an angle of up to 90 degrees with respect to the slot.

51. The slotted substrate of claim 39 further comprising a fluid drop generator formed on the first surface, wherein the slot walls has walls with edges, the slotted substrate further comprising a shelf in between the fluid drop generator and the slot edges, wherein the slot edges correspond to locations of the fluid drop generators.

52. The slotted substrate of claim 51 wherein a shelf distance remains substantially constant at each fluid drop generator.

53. The slotted substrate of claim 51 wherein the edges of the slot walls, as viewed from the first surface of the substrate, are jagged.

54. The substrate of claim 39 wherein the slot couples a recess in the second surface with two recesses in the first surface.

55. A slotted substrate comprising:

a first surface;

a second surface opposite the first surface; and a slot from the second surface to the first surface;

wherein the slot has side walls with projections, wherein the projections range up to about 3 microns.

56. The slotted substrate of claim 55 wherein the projections protrude from the side walls and are substantially parallel with the slot.

57. The slotted substrate of claim 55 wherein the projections along the sidewalls are directed towards the first surface of the substrate.

58. A slotted substrate comprising:

a first surface;

a second surface opposite the first surface; and a slot from the second surface to the first surface;

wherein a difference in width between the slot at the first surface, the slot at the second surface, and the slot in between the first and second surfaces is at most 6.5%.

59. The substrate of claim 58 wherein the difference in area between the slot at the first surface, the slot at the second surface, and the slot in between the first and second surfaces is about 3.5%.

60. The substrate of claim 58 wherein slot walls are coated with up to about 100 angstroms of residue.

61. A slotted substrate comprising:

a first surface;

a second surface opposite the first surface; and a slot from the second surface to the first surface, the slot having a first section adjacent the first surface, and a second section adjacent the second surface, wherein the first section has a first positively tapered profile, wherein the second section has a second positively tapered profile.

62. The slotted substrate of claim 61 wherein the first positively tapered profile is formed from a method comprising:

dry etching an exposed section of the second surface of the substrate to form a recess having inside surfaces;

coating the inside surfaces of the recess;

alternatingly repeating the etching and coating to form a trench from the second surface of the substrate; and wet etching the trench until a slot is formed through to a front side of the substrate.

63. The slotted substrate of claim 61 wherein the second positively tapered profile is formed from a method comprising:

dry etching an exposed section on the first surface of a substrate;

coating the etched section of the substrate; and alternatingly repeating the etching and the coating until the fluid feed slot through the substrate is formed.

64. The slotted substrate of claim 61 wherein both the first and second positively tapered profiles have taper angles that range up to about 25 degrees.

65. The slotted substrate of claim 64 wherein the first positively tapered profile and the second positively tapered profile have different taper angles.

66. A medical device manufactured by the method of claim 1.

* * * * *